(12) United States Patent
Briere

(10) Patent No.: US 9,087,812 B2
(45) Date of Patent: Jul. 21, 2015

(54) COMPOSITE SEMICONDUCTOR DEVICE WITH INTEGRATED DIODE

(75) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 177 days.

(21) Appl. No.: 13/544,267

(22) Filed: Jul. 9, 2012

(65) Prior Publication Data

US 2013/0015498 A1    Jan. 17, 2013

Related U.S. Application Data

(60) Provisional application No. 61/508,292, filed on Jul. 15, 2011.

(51) Int. Cl.
| | | |
|---|---|---|
| *H01L 29/778* | (2006.01) | |
| *H01L 29/417* | (2006.01) | |
| *H01L 21/8258* | (2006.01) | |
| *H01L 29/20* | (2006.01) | |
| *H01L 27/06* | (2006.01) | |

(52) U.S. Cl.
CPC ...... *H01L 29/41766* (2013.01); *H01L 21/8258* (2013.01); *H01L 27/0688* (2013.01); *H01L 29/7787* (2013.01); *H01L 27/0605* (2013.01); *H01L 27/0629* (2013.01); *H01L 29/2003* (2013.01); *H01L 2224/48091* (2013.01); *H01L 2924/13091* (2013.01)

(58) Field of Classification Search
CPC ............ H01L 29/2003; H01L 27/0605; H01L 29/66462; H01L 29/7787; H01L 27/0629; H01L 29/872; H01L 29/66143; H01L 27/0727; H01L 29/4175; H01L 31/035236; H01L 2224/32145; H01L 29/41758; H01L 29/861
USPC .................................................. 257/194–195
See application file for complete search history.

(56) References Cited

U.S. PATENT DOCUMENTS

| | | | | |
|---|---|---|---|---|
| 6,649,287 | B2 * | 11/2003 | Weeks et al. ................. | 428/698 |
| 7,838,907 | B2 * | 11/2010 | Shiraishi ...................... | 257/195 |
| 7,884,395 | B2 * | 2/2011 | Saito ............................ | 257/199 |
| 7,915,645 | B2 | 3/2011 | Briere | |
| 7,935,983 | B2 | 5/2011 | Saito et al. | |

(Continued)

FOREIGN PATENT DOCUMENTS

| | | |
|---|---|---|
| JP | H 8-274311 | 10/1996 |
| JP | 2009-54757 | 3/2009 |

(Continued)

*Primary Examiner* — Matthew W Such
*Assistant Examiner* — Ali Naraghi
(74) *Attorney, Agent, or Firm* — Farjami & Farjami LLP

(57) ABSTRACT

There are disclosed herein various implementations of composite semiconductor devices. In one implementation, such a composite semiconductor device includes a transition body formed over a diode, the transition body including more than one semiconductor layer. The composite semiconductor device also includes a transistor formed over the transition body. The diode may be connected across the transistor using through-semiconductor vias, external electrical connectors, or a combination of the two.

25 Claims, 5 Drawing Sheets

(56) References Cited

U.S. PATENT DOCUMENTS

| | | | |
|---|---|---|---|
| 2008/0315257 A1* | 12/2008 | Shiraishi | 257/195 |
| 2009/0008647 A1 | 1/2009 | Li | |
| 2009/0050939 A1 | 2/2009 | Briere | |
| 2009/0166677 A1* | 7/2009 | Shibata et al. | 257/192 |
| 2009/0189191 A1 | 7/2009 | Sato | |
| 2010/0301396 A1* | 12/2010 | Briere | 257/195 |
| 2011/0210337 A1* | 9/2011 | Briere | 257/76 |
| 2012/0145995 A1* | 6/2012 | Jeon et al. | 257/20 |
| 2012/0153300 A1 | 6/2012 | Lidow | |
| 2013/0015499 A1* | 1/2013 | Briere | 257/191 |

FOREIGN PATENT DOCUMENTS

| | | |
|---|---|---|
| JP | 2009-64883 | 3/2009 |
| WO | WO 90/07192 | 6/1990 |

\* cited by examiner

COMPOSITE SEMICONDUCTOR DEVICE WITH INTEGRATED DIODE

The present application claims the benefit of and priority to a provisional application entitled "III-Nitride Device Integration with Group IV P-N Antiparallel Diode," Ser. No. 61/508,292 filed on Jul. 15, 2011. The disclosure in this provisional application is hereby incorporated fully by reference into the present application.

BACKGROUND

I. Definitions

As used herein, the phrase "group III-V" refers to a compound semiconductor that includes a group V element and at least one group III element. Moreover, the phrase "III-Nitride" or "III-N" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende, or mixed polytypes, and may include single-crystal, monocrystalline, polycrystalline, or amorphous structures.

Also as used herein, the phrase "group IV" refers to a semiconductor that includes at least one group IV element, including silicon (Si), germanium (Ge), and carbon (C), and also includes compound semiconductors such as SiGe and SiC, for example. Group IV may also refer to a semiconductor material which consists of layers of group IV elements or doping of group IV elements to produce strained silicon or other strained group IV material. In addition, group IV based composite substrates may include semiconductor on insulator (SOI), separation by implantation of oxygen (SIMOX) process substrates, and silicon on sapphire (SOS), for example. Moreover, a group IV device may include devices formed using standard CMOS processing, but may also include NMOS and PMOS device processing.

The group III-V device can include any suitable semiconductor material that forms a field-effect transistor (FET) such as an insulated-gate FET (IGFET), or a high electron mobility transistor (HEMT), for example. Suitable semiconductor materials include group IV semiconductor materials such as Si, strained silicon, SiGe, SiC, and group III-V materials including III-As, III-P, III-Nitride or any of their alloys.

II. Background Art

Group III-V transistors, such as III-Nitride field-effect transistors (III-Nitride FETs) and III-Nitride high mobility electron transistors (III-Nitride HEMTs), are often utilized in high power switching applications due to their performance advantages. For example, III-Nitride FETs and III-Nitride HEMTs have a well deserved reputation for low on-state resistance with the ability to sustain high operating voltages.

However, and perhaps because of their tolerance for high voltage operation, high voltage (HV) group III-V transistors are sometimes implemented in extreme operating environments in which very high voltages can be produced. As a result, even nominally HV rated III-Nitride FETs and HV rated III-Nitride HEMTs may be susceptible to catastrophic failure in practice.

SUMMARY

The present disclosure is directed to a composite semiconductor device with integrated diode, substantially as shown in and/or described in connection with at least one of the figures, and as set forth more completely in the claims.

DETAILED DESCRIPTION

Figure 1:
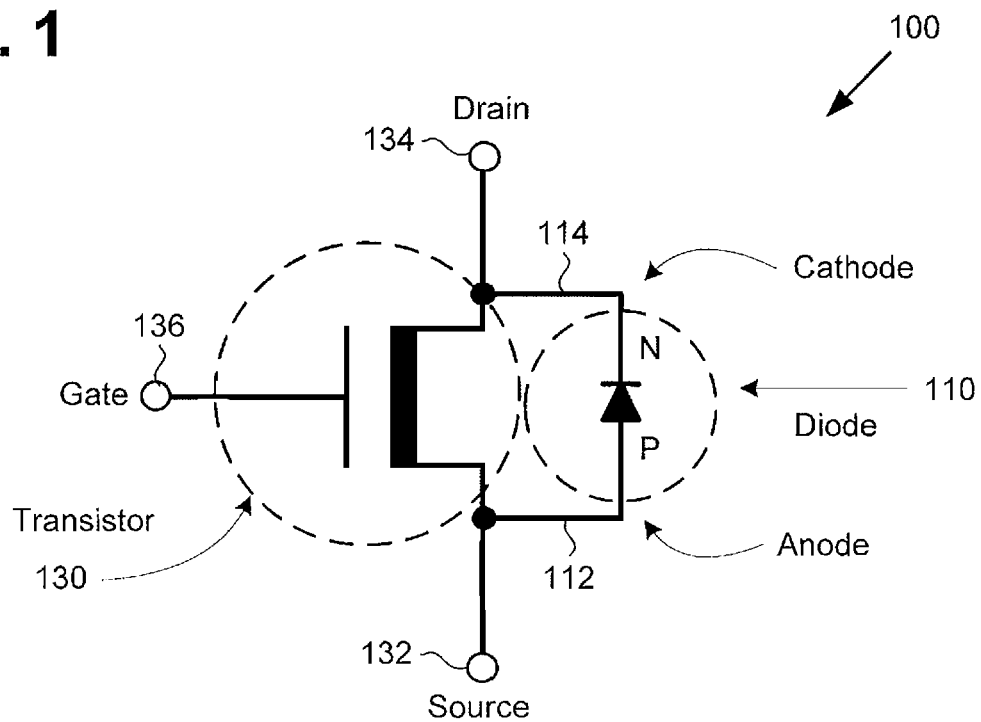
FIG. 1 presents a schematic diagram showing one exemplary implementation of a composite semiconductor device including a transistor and a diode.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, and the creation of two-dimensional electron gases (2DEGs). As a result, III-Nitride materials such as GaN are used in many microelectronic applications in which high power density and high efficiency switching are required.

As noted above, however, perhaps because of their known tolerance for high voltage operation, high voltage (HV) group III-V transistors such as III-Nitride transistors are sometimes implemented in extreme operating environments in which very high voltages can be produced. As a result, even nominally HV rated III-Nitride transistors may be susceptible to catastrophic failure. To prevent such catastrophic failure in implementations of the present inventive concepts, a diode is placed across the source and drain of the III-V transistor. This diode may be designed to have a breakdown voltage which is greater then the required operating voltage of the composite device and less than a voltage causing catastrophic failure of the group III-V transistor. Moreover, by monolithically integrating the composite device, the parasitic inductance between the diode and group III-V transistor can be minimized.

FIG. 1 presents a schematic diagram showing one exemplary implementation of a composite semiconductor device including a transistor and a diode. As shown in FIG. 1, composite semiconductor device 100 includes transistor 130 and diode 110 coupled across transistor 130. Transistor 130 includes source contact 132, drain contact 134, and gate contact 136, while diode 110 includes anode 112 and cathode 114. As further shown in FIG. 1, diode 110 may be coupled across transistor 130 in an antiparallel configuration. That is to say, anode 112 of diode 110 may be coupled to source contact 132 of transistor 130, and cathode 114 of diode 110 may be coupled to drain contact 134 of transistor 130.

Transistor 130, which may be an HV transistor, may be formed as a group III-V power transistor. In some implementations, for example, transistor 130 may be formed of a III-Nitride material such as GaN, and may be implemented as an insulated-gate field-effect transistor (IGFET) or as a heterostructure FET (HFET). In one implementation, transistor 130 may take the form of a metal-insulator-semiconductor FET (MISFET), such as a metal-oxide-semiconductor FET (MOSFET). Alternatively, when implemented as an HFET, transistor 130 may be a high electron mobility transistor (HEMT) having a 2DEG. According to one implementation, for example, transistor 130 may be configured to sustain a drain voltage of greater than approximately 600V with a gate rating of greater than approximately 20V.

According to the implementation shown by FIG. 1, diode 110 is a PN junction diode. Diode 110 may be implemented as an HV group IV PN diode, such as an HV silicon PN diode, for example. In other implementations, diode 110 may be a PIN diode. In one implementation, composite semiconductor device 100 includes transistor 130 monolithically integrated with diode 110, using a vertical integration scheme. Diode 110 may be integrated with transistor 130 in such a way as to provide for nondestructive avalanche breakdown capability of composite semiconductor device 100, thereby protecting transistor 130 from failing catastrophically. In some implementations, an HV PN diode serving as diode 110 is designed to have a breakdown voltage less than a breakdown voltage of transistor 130. For example, transistor 130 may have a breakdown voltage of 700V, while diode 110 may be designed to have an avalanche breakdown voltage of 650V. Diode 110 may be designed to have a lower or higher avalanche breakdown voltage based on the desired breakdown voltage of composite semiconductor device 100. As a result, the antiparallel configuration of diode 110 and transistor 130 represented in FIG. 1 can provide robust, failure resistant, composite semiconductor device 100.

As noted, in some implementations, composite semiconductor device 100 including transistor 130 and diode 110 may be monolithically integrated. Various integration schemes for monolithically integrating III-Nitride and group IV semiconductor devices are disclosed in U.S. Pat. No. 7,915,645 issued on Mar. 29, 2011, and titled "Monolithic Vertically Integrated Composite Group III-V and Group IV Semiconductor Device and Method for Fabricating Same;" in U.S. patent application Ser. No. 12/174,329 filed on Jul. 16, 2008, and titled "III-Nitride Device;" and in U.S. patent application Ser. No. 13/020,243 filed on Feb. 3, 2011, and titled "Efficient High Voltage Switching Circuits and Monolithic Integration of Same;" whose disclosures are hereby incorporated by reference into the present application in their entirety.

Figure 2:
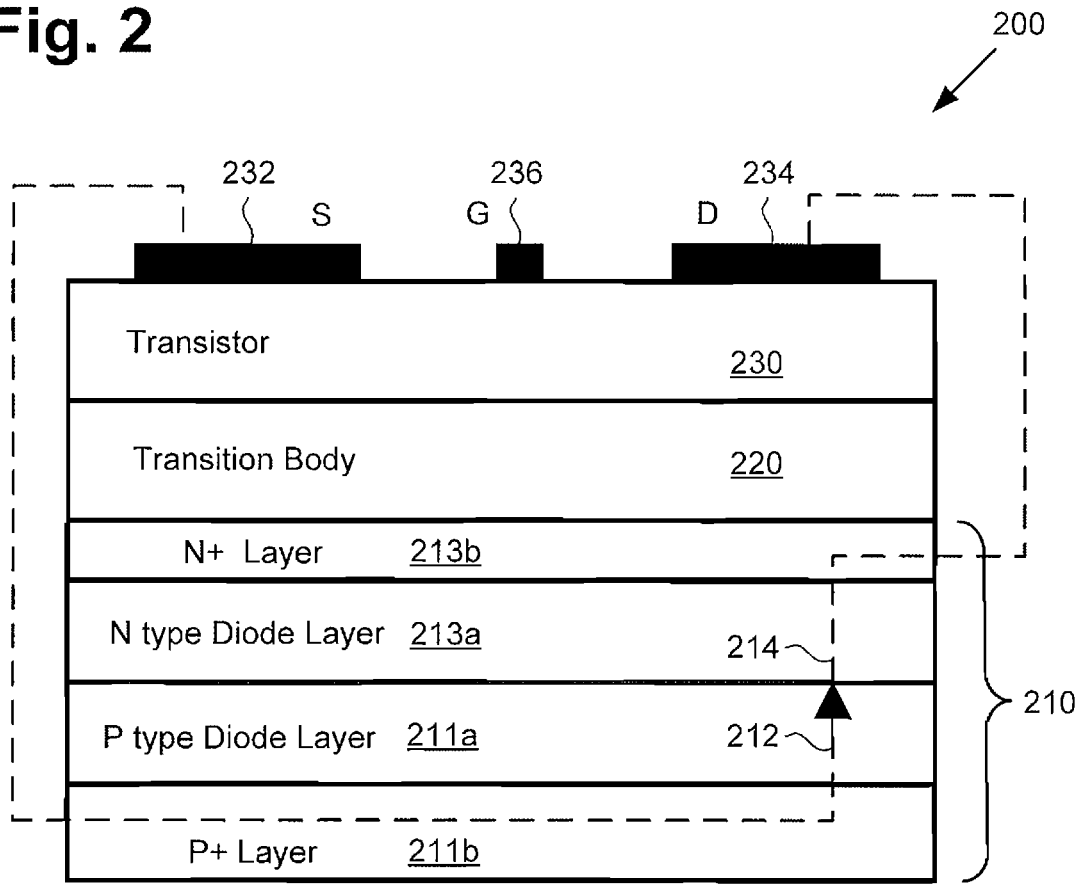
FIG. 2 presents a cross-sectional view of an exemplary structure implementing a composite semiconductor device including a transistor and a diode, corresponding in general to the schematic diagram of FIG. 1.

Referring now to FIG. 2, FIG. 2 presents a cross-sectional view of an exemplary structure implementing a composite semiconductor device including a transistor and a diode, corresponding in general to the schematic diagram of FIG. 1. As shown in FIG. 2, composite semiconductor device 200 includes diode 210, transition body 220 formed over diode 210, and transistor 230 formed over transition body 220.

Transistor 230 includes source electrode 232, drain electrode 234, and gate electrode 236, while diode 210 includes P type diode layer 211a providing anode 212, P+ contact and current spreading layer 211b, N type diode layer 213a providing cathode 214, and N+ contact and current spreading layer 213b. As further shown in FIG. 2, diode 210 is coupled across transistor 230 in an antiparallel configuration. In other words, anode 212 of diode 210 is coupled to source contact 232 of transistor 230, and cathode 214 of diode 210 is coupled to drain contact 234 of transistor 230. Transistor 230 including source electrode 232, drain electrode 234, and gate electrode 236, and diode 210 including anode 212 and cathode 214 correspond respectively to transistor 130 including source contact 132, drain contact 132, and gate contact 136, and diode 110 including anode 112 and cathode 114, in FIG. 1.

It is noted that transition body 220 is disposed between diode 210 and transistor 230 to mediate lattice mismatch between the material used to form diode 210 and the material used to form transistor 230, when diode 210 is formed as a group IV device within a group IV substrate and transistor 230 is formed as a group III-V device within a group III-V epitaxial layer or material system. Consequently, transition body 220 may include multiple group III-V material layers (not shown in FIG. 2), and/or may be implemented using a compositionally graded group III-V semiconductor body.

According to the implementation of FIG. 2, P type diode layer 211a and P+ contact and current spreading layer 211b, which may be P type silicon or other group IV semiconductor layers, are formed as a bottom portion of diode 210. N type diode layer 213a and N+ contact and current spreading layer 213b, which may be N type silicon or other group IV semiconductor layers, are formed as a top portion of diode 210 and are disposed over P type layers 211a and 211b. The interface of P type diode layer 211a with N type diode layer 213a forms a PN junction in diode 210. As a result, in the implementation of FIG. 2, diode 210 is a PN diode. A heterojunction group III-V transistor, such as a III-Nitride HEMT, can then be formed as transistor 230 over transition body 220 disposed above the top surface of N+ contact and current spreading layer 213b.

It is further noted that, although diode 210 is depicted as including respective P type and N type diode layers 211a and 213a, that representation is merely exemplary. In other implementations, for example, diode 210 may include an N type or P type diode layer having a respective P type or N type well formed therein. In such implementations, the interface of the well boundary with the opposite conductivity diode layer in which the well is formed may provide the PN junction of diode 210. In yet another implementation, diode 210 may be a PIN diode. As such, there may be an interlying intrinsic, near intrinsic or otherwise unintentionally doped layer or layers (not shown) disposed over P type diode layer 211a and under N type diode layer 213a, for example.

According to another implementation, diode 210 may be lifetime engineered to reduce the recovery time for stored charge. For example, PN diode 210 can be engineered by modifying the crystal structure using various common techniques known in the art including electron irradiation, ion implantation, and platinum doping, amongst others.

Thus, FIG. 2 shows the general formation of an integrated group III-V transistor with a group IV PN diode. In this configuration, diode 210 is connected in reverse bias. The avalanche breakdown voltage limit of diode 210 may be designed to a specific range and may be determined by the constituent dopants and concentrations of P type diode layer 211a providing anode 212 and N type diode layer 213a providing cathode 214. As noted above, because diode 210 is configured to protect transistor 230, with which diode 210 may be monolithically integrated, the design of diode 210 may be such that the avalanche breakdown voltage limit of diode 210 is lower than the breakdown voltage of transistor 230.

In certain other implementations, P type diode layer 211a and P+ contact and current spreading layer 211b may be formed and terminated through lithographically defined regions, for example implantation, diffusion and/or the use of conductive thin films (e.g., doped polysilicon) on the backside of a double sided finished group IV substrate as disclosed in U.S. Pat. No. 7,915,645 issued on Mar. 29, 2011, and titled "Monolithic Vertically Integrated Composite Group III-V and Group IV Semiconductor Device and Method for Fabricating Same," the disclosure of which is hereby incorporated by reference into the present application in its entirety.

Figure 3:
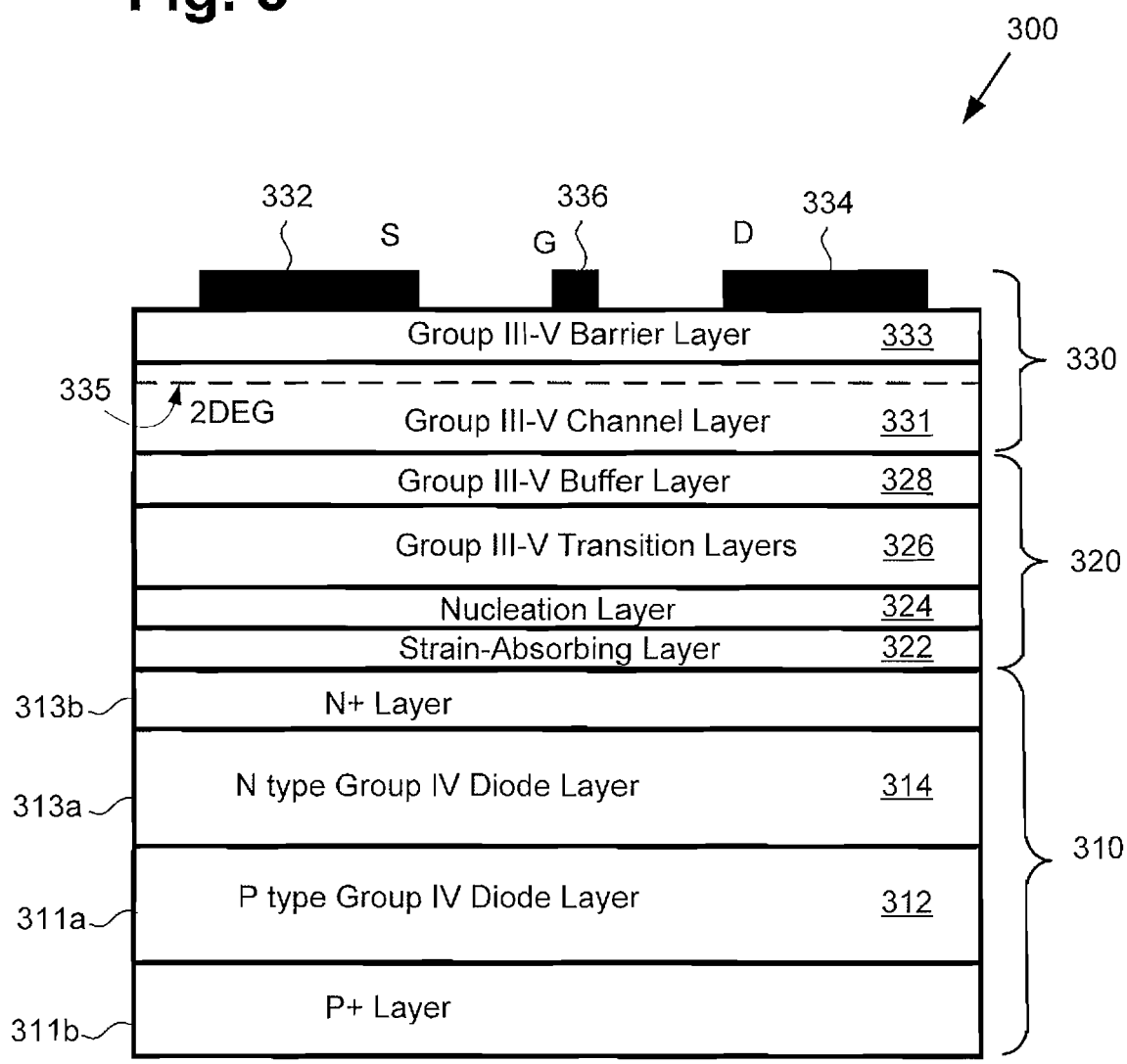
FIG. 3 presents a cross-sectional view of another exemplary structure implementing a composite semiconductor device including a transistor and a diode, corresponding in general to the schematic diagram of FIG. 1.

FIG. 3 presents a more detailed cross-sectional view of an exemplary structure for implementing a composite semiconductor device including a transistor and a diode. FIG. 3 focuses on the composition of the group III-V transition body and device layers utilized in the fabrication of an exemplary group III-V transistor. As shown in FIG. 3, composite semiconductor device 300 includes diode 310, transition body 320 formed over diode 310, and transistor 330 formed over transition body 320. It is noted that, according to the exemplary implementation of FIG. 3, transistor 330 is depicted as a group III-V HEMT.

Transistor 330 includes channel layer 331 and barrier layer 333 producing 2DEG 335 near their heterojunction interface, as well as source electrode 332, drain electrode 334, and gate electrode 336. Transition body 320 includes strain-absorbing layer 322, nucleation layer 324, transition layers 326, and buffer layer 328. Diode 310 includes P type diode layer 311a providing anode 312, P+ contact and current spreading layer 311b, N type diode layer 313a providing cathode 314 and disposed over P type diode layer 311a, and N+ contact and current spreading layer 313b disposed over N type diode layer 313a. Transistor 330 including source electrode 332, drain electrode 334, and gate electrode 336, and diode 310 including anode 312 and cathode 314 correspond respectively to transistor 130 including source contact 132, drain contact 134, and gate contact 136, and diode 110 including anode 112 and cathode 114, in FIG. 1. Moreover, transition body 320 corresponds to transition body 220 in FIG. 2.

As shown in FIG. 3, transition body 320 includes multiple semiconductor layers, e.g., at least group III-V transition layers 326 and group III-V buffer layer 328. According to one implementation, strain-absorbing layer 322 is formed over N type diode layer 313a. Strain-absorbing layer 322 may be an amorphous strain-absorbing layer, such as an amorphous silicon nitride layer. In this regard, the disclosure provided by U.S. Pat. No. 7,339,205 issued on Mar. 4, 2008, and titled "Gallium Nitride Materials and Methods Associated with the Same," is hereby incorporated by reference into the present application in its entirety.

According to the implementation shown in FIG. 3, nucleation layer 324 is formed over strain-absorbing layer 322. Nucleation layer 324 may be formed as an aluminum nitride (AlN) layer, and may be grown using any suitable techniques, as known in the art. Although FIG. 3 depicts nucleation layer 324 to be disposed over strain-absorbing layer 322, it is noted that, in some implementations, it may be desirable not to form strain-absorbing layer 322 prior to growing nucleation layer 324. Moreover, in some implementations, nucleation layer 324 includes one or more layers formed using different growth environments. In this latter regard, the disclosures provided by U.S. Pat. No. 6,617,060 issued on Sep. 9, 2003, and titled "Gallium Nitride Materials and Methods," and U.S. patent application Ser. No. 11/531,508 filed on Sep. 13, 2006, and titled "Process for Manufacture of Super Lattice Using Alternating High and Low Temperature Layers to Block Parasitic Current Path," are hereby incorporated by reference into the present application in their entirety.

Referring to transition layers 326, it is noted that in some implementations, transition body 320 and transistor 330 may be formed of compositionally graded III-Nitride materials. In such implementations, the specific compositions and thicknesses of III-Nitride transition layers 326 may depend on the diameter and thickness of the substrate used, and the desired performance of transistor 330. For example, the desired breakdown voltage of transistor 330, as well as the desired wafer bow and warp of composite semiconductor device 300 can influence the compositions and thicknesses of transition layers 326. In this regard, the disclosures provided by U.S. Pat. No. 6,649,287 issued on Nov. 18, 2003, and titled "Gallium Nitride Materials and Methods;" U.S. patent application Ser. No. 12/587,964 filed on Oct. 14, 2009, and titled "Group III-V Semiconductor Device with Strain-relieving Interlayers;" U.S. patent application Ser. No. 12/928,946 filed on Dec. 21, 2010, and titled "Stress Modulated Group III-V Semiconductor Device and Related Method;" U.S. Pat. No. 7,112,830 issued on Sep. 26, 2006, and titled "Super Lattice Modification of Overlying Transistor;" U.S. Pat. No. 7,456,442 issued on Nov. 25, 2008, and titled "Super Lattice Modification of Overlying Transistor;" U.S. patent application Ser. No. 11/531,508 filed on Sep. 13, 2006, and titled "Process for Manufacture of Super Lattice Using Alternating High and Low Temperature Layers to Block Parasitic Current Path;" and U.S. Provisional Patent Application No. 61/449,046 filed on Mar. 3, 2011, and titled "III-Nitride Material Interlayer Structures," are hereby incorporated by reference into the present application in their entirety.

As further shown in FIG. 3, transition body 320 also includes buffer layer 328. According to one implementation, buffer layer 328 is disposed over transition layers 326. Buffer layer 328 may be formed of any suitable group III-V semiconductor material. Where transistor 330 is implemented as a III-Nitride HEMT, for example, buffer layer 328 may be formed as a doped or undoped III-Nitride layer. For instance, in one implementation, buffer layer 328 may be an intrinsic GaN layer, grown using any suitable technique, as known in the art.

Transistor 330 including channel layer 331 and barrier layer 333 is formed over transition body 320. In one implementation, for example, a III-Nitride HEMT may be formed through use of a GaN layer as channel layer 331 and use of an AlGaN layer as barrier layer 333. As shown in FIG. 3, 2DEG 335 is produced by the heterojunction forming the interface of channel layer 331 and barrier layer 333. In certain applications, it may be desirable to form barrier layer 333 over a spacer layer (or layers) disposed between barrier layer 333 and channel layer 331.

Source electrode 332, drain electrode 334, and gate electrode 336 are formed over barrier layer 333. Source electrode 332 and drain electrode 334 are formed such that they make ohmic contact with 2DEG 335. In the implementation shown by FIG. 3, gate electrode 336 makes Schottky contact with barrier layer 333 and is formed directly on barrier layer 333, or on a thin (e.g., 1-3 nanometers thick) capping layer of GaN or AlGaN disposed above barrier layer 333. According to the present exemplary implementation, transistor 330 forms a normally ON (depletion mode) HEMT. In some applications, however, it may be desirable to form an insulated gate transistor by forming an insulating layer between gate electrode 336 and barrier layer 333 as discussed below with reference to FIG. 4. In some other applications, it may be desirable to form a gate insulated normally OFF (enhancement mode) HEMT as transistor 330. That is to say in addition to having an insulated gate, it may be desirable in some circumstances to have 2DEG 335 interrupted under gate electrode 336 in the absence of an applied gate voltage.

Several modifications to the design of transistor 330 can result in formation of a normally OFF enhancement mode HEMT. For example, an additional layer of P type III-Nitride or other group III-V material may be disposed under gate electrode 336, or a floating gate design may be utilized. Alternatively, or in addition, the region under gate electrode 336 may be doped so as to deplete 2DEG 335 under gate electrode 336, while other techniques exist as well. In this regard, the disclosures provided by U.S. Pat. No. 7,382,001 issued Jun. 3, 2008, and titled "Enhancement Mode III-Nitride FET;" U.S. Pat. No. 7,759,699 issued on Jul. 20, 2010, and titled "III-Nitride Enhancement Mode Devices;" U.S. Pat. No. 8,084,785 issued on Dec. 27, 2011, and titled "III-Nitride Power Semiconductor Device Having a Programmable Gate;" U.S. patent application Ser. No. 11/460,725 filed on Jul. 28, 2006, and titled "Normally Off III-Nitride Semiconductor Device Having a Programmable Gate;" U.S. Pat. No. 7,745,849 issued on Jun. 29, 2010, and titled "Enhancement Mode III-Nitride Semiconductor Device with Reduced Electric Field Between the Gate and the Drain;" U.S. patent application Ser. No. 12/195,801 filed on Aug. 21, 2008, and titled "Enhancement Mode III-Nitride Device with Floating Gate and Process for its Manufacture;" and U.S. patent application Ser. No. 13/017,970 filed on Jan. 31, 2011, and titled "Enhancement Mode III-Nitride Transistors with Single Gate Dielectric Structure," are hereby incorporated by reference into the present application in their entirety.

It is noted that transistor 330 may include one or more additional layers disposed between barrier layer 333 and source electrode 332, drain electrode 334, and gate electrode 336. These additional layers may include additional III-Nitride or other group III-V semiconductor layers, insulating layers, passivation layers, spacer layers between the channel and barrier layers, field plates and/or metal layers for additional interconnects. The voltage handling and breakdown capability of transistor 330 is determined by the various compositions, thicknesses, and spacings of several of the layers discussed above and shown in FIG. 3. These include, among others, the thickness and alloy composition of barrier layer 333, the design and composition of gate electrode 336, and the spacing between gate electrode 336 and a drain corresponding to drain electrode 334 (as well as the spacing between gate electrode 336 and a source corresponding to source electrode 332).

Figure 4:
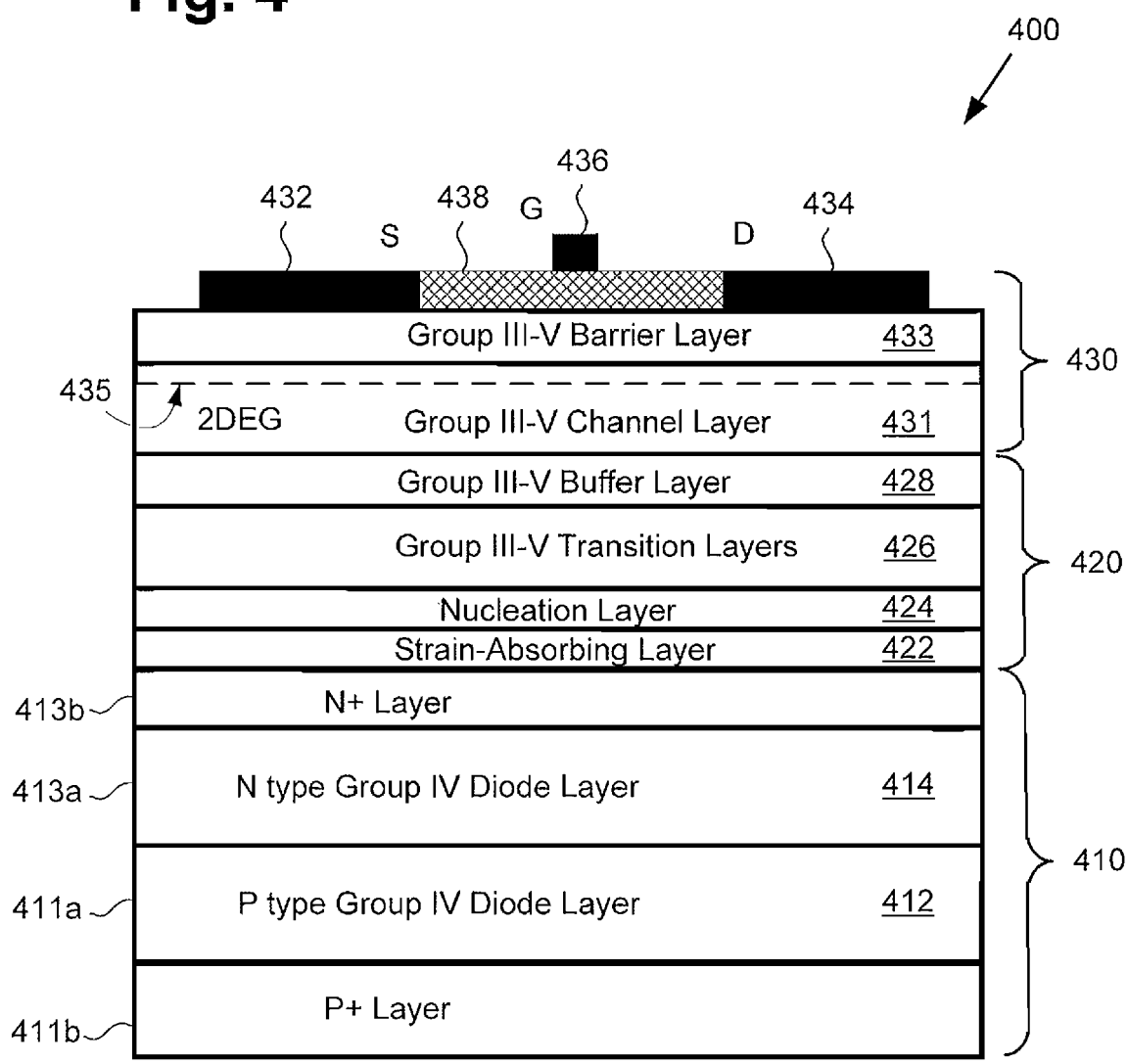
FIG. 4 presents a cross-sectional view of yet another exemplary structure implementing a composite semiconductor device including a transistor and a diode, corresponding in general to the schematic diagram of FIG. 1.

Moving to FIG. 4, FIG. 4 presents a cross-sectional view of another exemplary structure for implementing a composite semiconductor device including a transistor and a diode. Composite semiconductor device 400 includes diode 410, transition body 420 formed over diode 410, and transistor 430 formed over transition body 420. Transistor 430 includes channel layer 431 and barrier layer 433 producing 2DEG 435 near their heterojunction interface, as well as source electrode 432, drain electrode 434, and gate electrode 436 disposed over gate dielectric 438. Transition body 420 includes strain-absorbing layer 422, nucleation layer 424, transition layers 426, and buffer layer 428. Diode 410 includes P type diode layer 411a providing anode 412, P+ contact and current spreading layer 411b, N type diode layer 413a providing cathode 414 and disposed over P type diode layer 411a, and N+ contact and current spreading layer 411b disposed over N type diode layer 411a.

Diode 410, and transition body 420 correspond respectively to diode 310, and transition body 320, in FIG. 3. Transistor 430, in FIG. 4, represents a modification to transistor 330, in FIG. 3, through substitution of an insulated gate structure for the previous Schottky gate. In the implementation of FIG. 4, gate dielectric 438 is formed over the surface of barrier layer 433, between gate electrode 436 and barrier layer 433. In one implementation, for example, gate dielectric 438 may be formed of stoichiometric silicon nitride. In another implementation, several dielectric layers may be used. In yet other implementations, one or more dielectric materials other than silicon nitride may be utilized to form gate dielectric 438.

In order to couple diode 410 across transistor 430 in a reverse bias or antiparallel configuration, anode 412 of diode 410 should be connected to source electrode 432 of transistor 430, and cathode 414 of diode 410 should be connected to drain electrode 434 of transistor 430. There are various physical means of electrically coupling the diode to the transistor, several examples of which are described below by reference to FIGS. 5 and 6.

Figure 5:
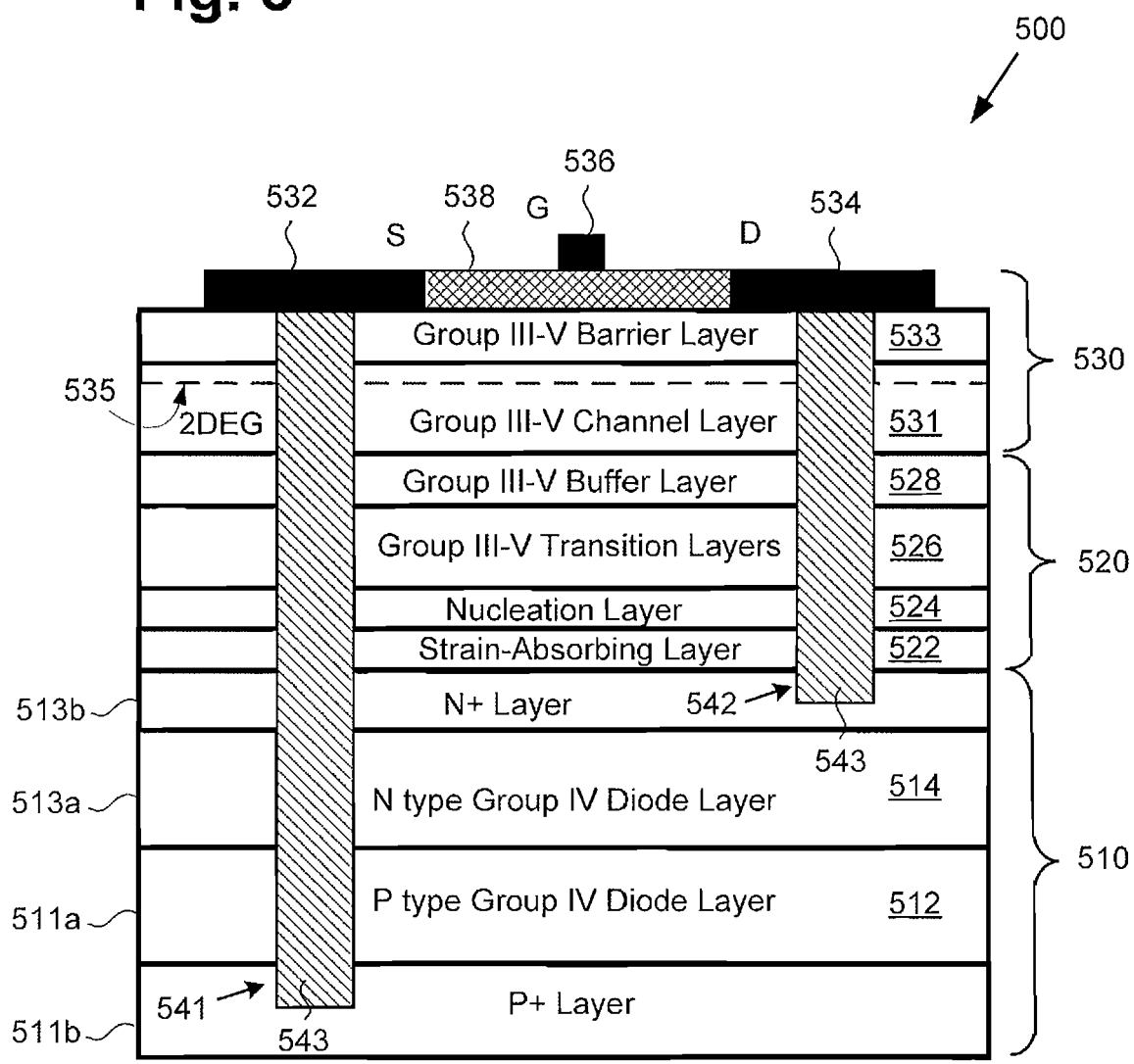
FIG. 5 presents a more detailed cross-sectional view of an exemplary structure for implementing a composite semiconductor device including a transistor coupled to a diode using through-semiconductor vias.

FIG. 5 shows an exemplary solution for forming such connections using through-semiconductor vias. It is noted that although FIG. 5 expressly teaches the use of through-semiconductor vias in conjunction with the composite semiconductor device structure shown by FIG. 4, one of ordinary skill in the art will recognize that the solution disclosed by FIG. 5 can be adapted for use with the composite semiconductor device structures shown by FIGS. 2 and 3.

Composite semiconductor device 500 includes diode 510, transition body 520 formed over diode 510, and transistor 530 formed over transition body 520. Transistor 530 includes channel layer 531 and barrier layer 533 producing 2DEG 535 near their heterojunction interface, as well as source electrode 532, drain electrode 534, and gate electrode 536 disposed over gate dielectric 538. Transition body 520 includes strain-absorbing layer 522, nucleation layer 524, transition layers 526, and buffer layer 528. Diode 510 includes bottom P type layers including P type diode layer 511a providing anode 512 and P+ contact and current spreading layer 511b, top N type layers including N type diode layer 513a providing cathode 514 and disposed over P type diode layer 511a, and N+ contact and current spreading layer 513b. Also shown in FIG. 5 are first through-semiconductor via 541 including conductive fill 543 and second through-semiconductor via 542 including conductive fill 543.

Diode 510, transition body 520, and transistor 530 correspond respectively to diode 410, transition body 420, and transistor 430, in FIG. 4, and may share any of the characteristics attributed to those corresponding features, above. As shown in FIG. 5, first and second through-semiconductor vias 541 and 542 extend through transition body 520 to couple diode 510 across transistor 530 in an antiparallel configuration. That is to say, first through-semiconductor via 541 connects anode 512 of diode 510 to source electrode 532 of transistor 530, and second through-semiconductor via 542 connects cathode 514 of diode 510 to drain electrode 534 of transistor 530.

As further shown in FIG. 5, according to one implementation, first through-semiconductor via 541 extends from source electrode 532 down through barrier layer 533 and channel layer 531 of transistor 530 to terminate in P+ contact and current spreading layer 511b. En route, first through-semiconductor via 541 also extends through the multiple group material layers of transition body 520, i.e., buffer layer 528, transition layers 526, and nucleation layer 524, as well as through strain-absorbing layer 522 of transition body 520, through N+ contact and current spreading layer 513b, N type diode layer 513a and P type diode layer 511a.

First through-semiconductor via 541 includes conductive fill 543, such as an electrically conductive metal or polysilicon fill, for example, which forms an anode electrode electrically coupling anode 512 to source electrode 532. Examples of materials suitable for use as conductive fill 543 include copper (Cu), tungston (W), doped polysilicon, or any of a variety of conductive metal alloys. In some implementations, it may be desirable to utilize a different conductive material to form conductive fill 543 than that used to implement source electrode 532.

According to the implementation shown in FIG. 5, second through-semiconductor via 542 extends from drain electrode 534 down through barrier layer 533 and channel layer 531 of transistor 530 to terminate in N+ contact and current spreading layer 513b. Second through-semiconductor via 542 also extends through the multiple group III-V material layers of transition body 520. Second through-semiconductor via 542 also includes conductive fill 543, which forms a cathode electrode electrically coupling cathode 514 to drain electrode 534. In some implementations, it may be desirable to utilize a different conductive material to form conductive fill 543 than that used to implement drain electrode 534.

It is noted that in certain implementations, it may be desirable that first and second through-semiconductor vias 541 and 542 include a sidewall dielectric (not shown). The sidewall dielectric may be a sidewall oxide, for example, such as a deposited oxide. In some implementations, it may be advantageous or desirable to include the added electrical isolation provided by the sidewall dielectric between conductive fill 543 and the diode, and/or transition body, and transistor layers penetrated by one or both of first and second through-semiconductor vias 541 and 542. In those implementation it is noted that the sidewall dielectric is not disposed at the respective bottom surfaces of first and second through-semiconductor vias 541 and 542. As a result, conductive fill 543 of first through-semiconductor via 541 is ohmically coupled to anode 512, and conductive fill 543 of second through-semiconductor via 542 is ohmically coupled to cathode 514.

Figure 6:
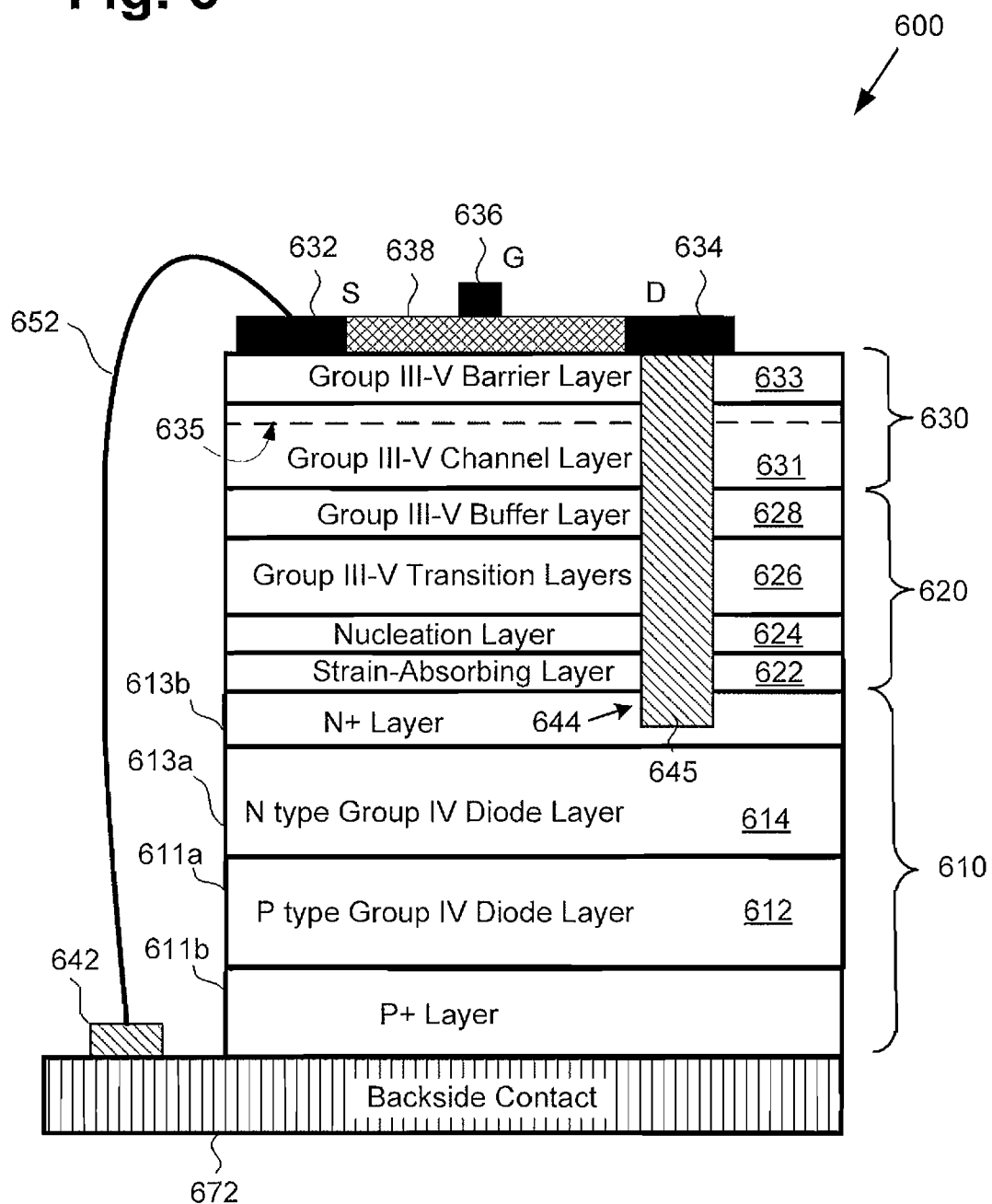
FIG. 6 presents a detailed cross-sectional view of another exemplary structure for implementing a composite semiconductor device including a transistor coupled to a diode using an external electrical connector and a through-semiconductor via.

FIG. 6 presents a cross-sectional view of another exemplary implementation of a composite semiconductor device including a transistor and a diode, utilizing a through-semiconductor via and an external electrical connector. It is noted that although FIG. 6 expressly teaches the use of an external electrical connector in conjunction with the composite semiconductor device structure shown by FIG. 4, one of ordinary skill in the art will recognize that the solution disclosed by FIG. 6 can be adapted for use with the composite semiconductor device structures shown by FIGS. 2 and 3.

Referring to FIG. 6, composite semiconductor device 600 includes diode 610, transition body 620 formed over diode 610, and transistor 630 formed over transition body 620. Transistor 630 includes channel layer 631 and barrier layer 633 producing 2DEG 635 near their heterojunction interface, as well as source electrode 632, drain electrode 634, and gate electrode 636 disposed over gate dielectric 638. Transition body 620 includes strain-absorbing layer 622, nucleation layer 624, transition layers 626, and buffer layer 628. Diode 610 includes P type diode layer 611a providing anode 612, P+ contact and current spreading layer 611b, N type diode layer 613a providing cathode 614 and disposed over P type diode layer 611a, and N+ contact and current spreading layer 611b. Also shown in FIG. 6 are through-semiconductor via 644 including conductive fill 645, backside contact 672, anode electrode 642 and external electrical connector 652.

Diode 610 corresponds to diode 410, in FIG. 4. In addition, transition body 620, in FIG. 6, corresponds to transition body 420, in FIG. 4. As shown in FIG. 6, through-semiconductor via 644 extends through transition body 620 to connect drain electrode 634 to cathode 614 by terminating in N+ contact and current spreading layer 613b. As further shown in FIG. 6, external electrical connector 652 connects source electrode 632 to anode 612 through anode electrode 642, backside contact 672, and P+ contact and current spreading layer 611b. In other words, diode 610 is coupled across transistor 630 in an antiparallel configuration using an internal electrical connector, implemented as through-semiconductor via 644 including conductive fill 645, and external electrical connector 652.

In one implementation, external electrical connector 652 may include one or more bond wires, such as gold (Au) or copper (Cu) bond wires, for example. However, in other implementations, external electrical connectors 652 may take the form of conductive ribbons, conductive metal clips, or other connectors formed of conductive materials such as Al, Au, Cu, and/or other metals or composite materials.

Backside contact 672 may be formed of metal or doped polysilicon, for example, or any other suitable conductive material. In certain other implementations, backside contact 672 may be formed on the backside of a double sided finished group IV substrate as disclosed in U.S. Pat. No. 7,915,645 issued on Mar. 29, 2011, and titled "Monolithic Vertically Integrated Composite Group III-V and Group IV Semiconductor Device and Method for Fabricating Same." The entire disclosure of U.S. Pat. No. 7,915,645 is hereby incorporated fully by reference into the present application. In certain other implementations, backside contact 672 may comprise several conductive elements including conductive bond pads, solder, conductive paste or epoxy and/or a conductive substrate or leadframe of a package, for example.

According to the implementation shown in FIG. 6, through-semiconductor via 644 extends from drain electrode 634 down through barrier layer 633 and channel layer 631 of transistor 630 to terminate in N+ type contact and current spreading layer 613b. Through-semiconductor via 644 also extends through the multiple group III-V material layers of transition body 620. Through-semiconductor via 644 also includes conductive fill 645, which forms a cathode electrode electrically coupling cathode 614 to drain electrode 634.

It is noted that the implementation described above in FIG. 6 may be reversed such that the through-substrate via couples source contact 632 to anode 612 of diode 610, and the external connector is used to couple drain contact 634 to cathode 614 of diode 610. Additionally, and as described above in conjunction with FIG. 5, through-substrate via 644 may also include a sidewall dielectric.

Thus, by coupling a diode having a breakdown voltage less than a breakdown voltage of a transistor, across the transistor in an antiparallel configuration, the present application discloses a composite semiconductor device designed to provide voltage protection for the transistor. In addition, by utilizing an HV transistor and antiparallel HV diode, the present application discloses a rugged, durable HV composite semiconductor device suitable for use in extreme operating environments. Moreover, by implementing one or both of through-semiconductor vias and external electrical connectors to couple the diode across the transistor in the antiparallel configuration, the present application discloses a monolithically integrated composite semiconductor device having voltage protection.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A composite semiconductor device comprising:
    a diode including an anode having first and second anode layers, and a cathode having first and second cathode layers disposed over said first and second anode layers;
    a transition body formed over said cathode, said transition body including a plurality of semiconductor layers;
    a transistor formed over said transition body, said transistor including a source and a drain;
    said source being connected to said diode by a first electrical connector;
    said drain being connected to said diode by a second electrical connector.

2. The composite semiconductor device of claim 1, wherein said transition body is compositionally graded.

3. The composite semiconductor device of claim 1, wherein said transistor comprises a group III-V high electron mobility transistor (HEMT).

4. The composite semiconductor device of claim 1, wherein said diode is a PN junction diode.

5. The composite semiconductor device of claim 4, wherein said PN junction diode is lifetime engineered to reduce a recovery time for the stored charge of the diode.

6. The composite semiconductor device of claim 1, wherein said diode is a PIN diode.

7. The composite semiconductor device of claim 1, wherein said diode comprises a group IV diode.

8. The composite semiconductor device of claim 1, wherein said first electrical connector connects said anode of said diode to said source of said transistor and said second electrical connector connects said cathode of said diode to said drain of said transistor.

9. The composite semiconductor device of claim 1, wherein a breakdown voltage of said transistor is greater than a breakdown voltage of said diode.

10. The composite semiconductor device of claim 1, wherein said first and second electrical connectors are implemented using respective first and second through-semiconductor vias.

11. The composite semiconductor device of claim 10, wherein at least one of said first and second through-semiconductor vias includes a sidewall dielectric.

12. The composite semiconductor device of claim 1, wherein at least one of a cathode electrode and an anode electrode of said diode is connected through a backside contact of said composite semiconductor device.

13. The composite semiconductor device of claim 1, wherein one of said first and second electrical connectors is implemented using a through-semiconductor via and another one of said first and second electrical connectors is implemented using an external electrical connector.

14. A composite semiconductor device comprising:
    a group IV diode including an anode having first and second anode layers, and a cathode having first and second cathode layers disposed over said first and second anode layers;
    a group III-V transition body formed over said cathode, said group III-V transition body including plurality of group III-V semiconductor layers;
    a group III-V transistor formed over said group III-V transition body, said group III-V transistor including a source and a drain;
    said source being connected to said group IV diode by a first electrical connector,
    said drain being connected to said group IV diode by a second electrical connector.

15. The composite semiconductor device of claim 14, wherein said group III-V transition body is compositionally graded.

16. The composite semiconductor device of claim 14, wherein said group III-V transistor comprises a group III-V high electron mobility transistor (HEMT).

17. The composite semiconductor device of claim 14, wherein said group IV diode is a group IV PN junction diode.

18. The composite semiconductor device of claim 17, wherein said group IV PN junction diode layer is lifetime engineered to reduce a recovery time for the stored charge of the diode.

19. The composite semiconductor device of claim 14, wherein said group IV diode is a group IV PIN diode.

20. The composite semiconductor device of claim 14, wherein said group IV diode is coupled across said group III-V transistor in an antiparallel configuration.

21. The composite semiconductor device of claim 14, wherein a breakdown voltage of said group III-V transistor is greater than a breakdown voltage of said group IV diode.

22. The composite semiconductor device of claim 14, wherein said first and second electrical connectors are implemented using respective first and second through-semiconductor vias.

23. The composite semiconductor device of claim 22, wherein at least one of said first and second through-semiconductor vias includes a sidewall dielectric.

24. The composite semiconductor device of claim 14, wherein at least one of a cathode electrode and an anode electrode of said group IV diode is connected through a backside contact of said composite semiconductor device.

25. The composite semiconductor device of claim 14, wherein one of said first and second electrical connectors is implemented using a through-semiconductor via and another one of said first and second electrical connectors is implemented using an external electrical connector.

* * * * *